(12) United States Patent
Takeuchi

(10) Patent No.: US 6,573,029 B1
(45) Date of Patent: Jun. 3, 2003

(54) SEMICONDUCTOR DEVICE AND METHOD OF FORMING THE SAME AS WELL AS A PHOTO-MASK USED THEREIN

(75) Inventor: Mami Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,528

(22) Filed: Apr. 10, 2000

(30) Foreign Application Priority Data

Apr. 9, 1999 (JP) .......................................... 11-103363

(51) Int. Cl.[7] .............................. G03F 7/20; G03F 7/00
(52) U.S. Cl. ...................... 430/313; 430/311; 430/396; 430/5
(58) Field of Search ............................ 430/5, 311, 313, 430/396

(56) References Cited

U.S. PATENT DOCUMENTS

| | | | | |
|---|---|---|---|---|
| 4,525,448 A | * | 6/1985 | Ghosh ........................ | 430/314 |
| 4,657,379 A | * | 4/1987 | Suwa .......................... | 355/53 |
| 5,298,365 A | * | 3/1994 | Okamoto et al. ............ | 430/311 |
| 5,585,210 A | * | 12/1996 | Lee et al. ...................... | 430/5 |
| 5,712,063 A | * | 1/1998 | Ahn et al. ...................... | 430/5 |
| 5,725,973 A | * | 3/1998 | Han et al. ....................... | 430/5 |
| 5,736,300 A | * | 4/1998 | Mizuno et al. .............. | 430/313 |

FOREIGN PATENT DOCUMENTS

| | | |
|---|---|---|
| JP | 61-270823 | 12/1986 |
| JP | 7-134395 | 5/1995 |

* cited by examiner

*Primary Examiner*—Mark F. Huff
*Assistant Examiner*—Nicole Barreca
(74) *Attorney, Agent, or Firm*—Young & Thompson

(57) ABSTRACT

A method of forming a device pattern of a semiconductor device. The method includes the steps of carrying out an over-exposure to a resist film using a mask which has transmission regions which are positioned about a circumference of each of intended patterns of a resist film. Then carrying out a development of the resist film to form a resist pattern having the intended patterns. And then forming a device pattern of a semiconductor device by use of the resist pattern.

9 Claims, 15 Drawing Sheets

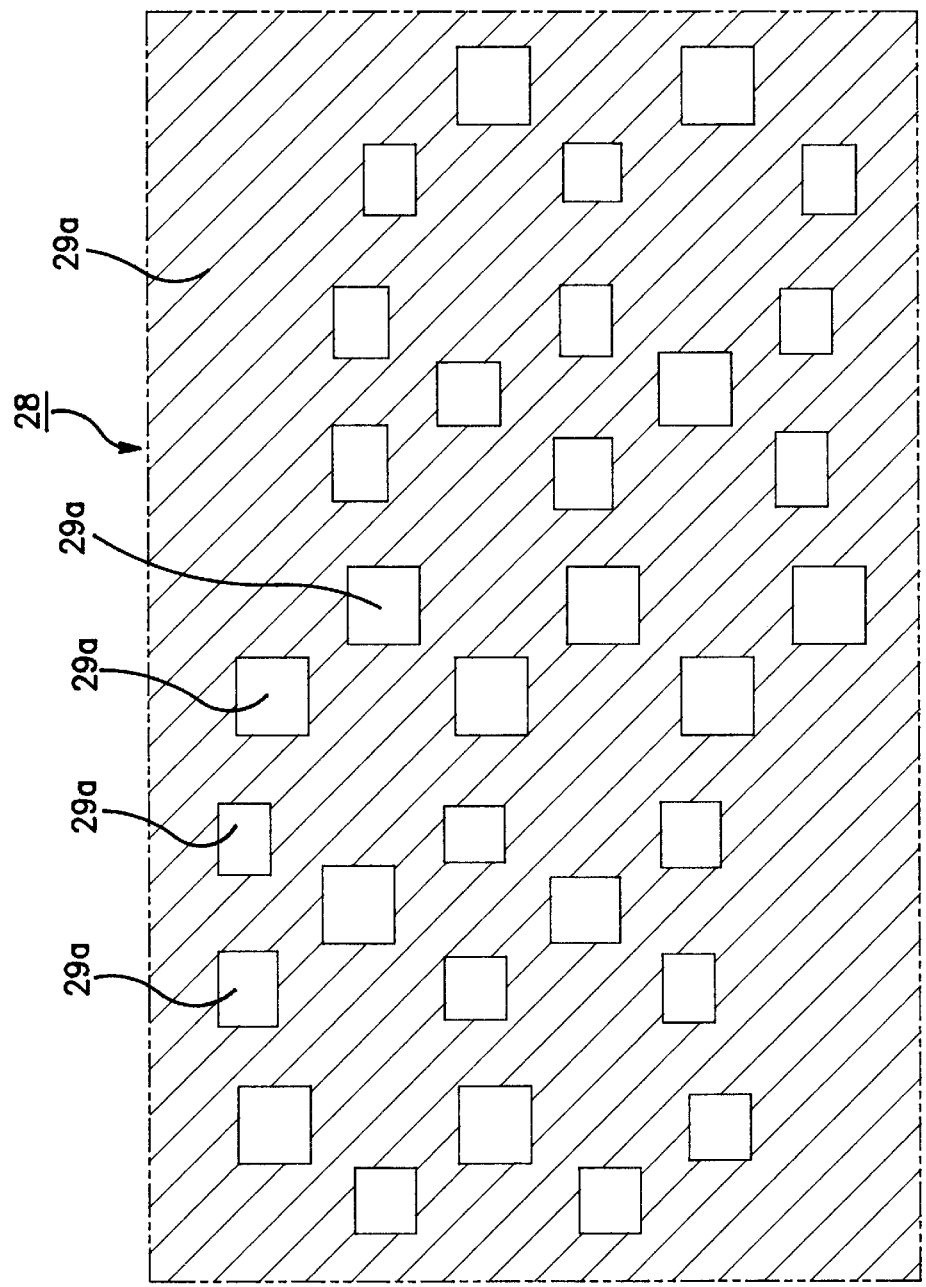

SEMICONDUCTOR DEVICE AND METHOD OF FORMING THE SAME AS WELL AS A PHOTO-MASK USED THEREIN

BACKGROUND OF THE INVENTION

The present invention relates to a semiconductor device having an improved pattern and a method of forming the same as well as a photo-mask used in the method of forming the semiconductor device, and more particularly to a method of forming a pattern for capacitors of dynamic random access memories needed to be increased in capacity but in a limited occupied area, and a method of forming the same as well as a photo-mask.

The dynamic random access memory has memory cell arrays, each of which comprises a switching transistor and a capacitor. The requirement for an increase in the density of integration of the dynamic random access memory has been on the rise, whereby it has become important to obtain a required capacity in a limited or reduced occupied area of the capacitor. A stacked capacitor and a trench capacitor are examples of the proposed capacitors having a three-dimensional structure. The three-dimensional structure contributes to increase a surface area of the capacitor for allowing the capacitor to increase in capacity but in the limited or reduced occupied area.

FIG. 1 is a plan view illustrative of a conventional mask pattern to be used for patterning a storage electrode or a bottom electrode of a stacked capacitor. This mask pattern is for a positive type photo-resist. Rectangular-shaped opaque patterns 100 are aligned in matrix over the photo-mask, wherein the rectangular-shaped opaque patterns 100 do shield the ray. Positions of the rectangular-shaped opaque patterns 100 correspond to positions where the storage electrodes are intended to be formed. This mask pattern is used to carry out an exposure process under such conditions as to prevent adjacent rectangular-shaped opaque patterns 100 from being in contact with each other. Therefore, the photo-resist film is subjected to the exposure and subsequent development to form a photo-resist pattern. This photo-resist pattern is used as a mask for patterning a base conductive film to form the storage electrode. Circle-shaped broken lines 101 represent capacitive contact patterns.

The above conventional mask pattern has the following problem. FIG. 2 is a plan view illustrative of a photo-resist pattern formed by a photo-lithography using the photo mask pattern shown in FIG. 1. Even though the rectangular-shaped opaque patterns 100 are sharply rectangular shaped, an elliptically shaped photo-resist pattern 102 as shown in FIG. 2 is formed by a photo-lithography using the photo mask pattern of FIG. 1 due to an optical proximity effect. If a micro-pattern size is close to a limitation of the resolving power of the exposure system, then the resist pattern 102 formed by a photo-lithography using the photo mask pattern sharply rectangular shaped has rounded corners. This means that the resist pattern is different in shape from the photo-mask pattern due to the optical proximity effect, particularly if the pattern size is close to the limitation of the resolving power of the exposure system. The corners of the resist pattern 102 are rounded. This means that the actual area of the resist pattern 102 is smaller than the intended area thereof. This results in that the actual surface area of the capacitor is smaller than the intended area thereof, whereby the actual capacity of the capacitor is lower than the intended capacity of the capacitor. FIG. 3 is a plan view illustrative of a photo-resist pattern formed by a photo-lithography using the photo mask pattern shown in FIG. 1, wherein the size of the photo-resist pattern 103 is close to the limitation of the resolving power of the exposure system. If the size of the photo-resist pattern 103 is close to the limitation of the resolving power of the exposure system, then the optical proximity effect is more remarkable, whereby the shape of the resist pattern is closer to circular and the area of the resist pattern is more reduced. This results in that the actual area of the obtained capacitor is much smaller than the intended area of the ideal capacitor. Even if each corner of the rectangular-shaped opaque pattern 100 extends outwardly for the purpose of compensation of the optical proximity effect, then the scaling down of the pattern makes it difficult to compensate for the deformation of the photo-resist pattern.

The dynamic random access memory having the stacked capacitor is isolated into a capacitor under bit-line structure and a capacitor over bit-line structure. In the capacitor under bit-line structure, the capacitor is placed under the bit-line. In the capacitor over bit-line structure, the capacitor is placed over the bit-line. Particularly, in the capacitor under bit-line structure, it is essential to reduce the size of the pattern of the storage electrode for the purpose of securing a sufficient margin between the bit-contact and the storage electrode, resulting in further reduction in capacity.

In the above circumstances, it had been required to develop a novel semiconductor device such as a dynamic random access memory having capacitors with a large capacity but a limited or reduced occupied area and a method of forming the same as well as a photo-mask to be used therein, which are, however, free from the above problem.

SUMMARY OF THE INVENTION

Accordingly, it is an object of the present invention to provide a novel semiconductor device such as a dynamic random access memory having capacitors with a large capacity but a limited or reduced occupied area free from the above problems.

It is a further object of the present invention to provide a novel method of forming a semiconductor device such as a dynamic random access memory having capacitors with a large capacity but a limited or reduced occupied area.

It is a still further object of the present invention to provide a novel photo-mask to be used for forming a capacitor having a large capacity but a limited or reduced occupied area in a semiconductor device The first present invention provides a semiconductor device having at least a pattern which is defined by a non-straight line.

The second present invention also provides a resist pattern having at least a pattern which is defined by a non-straight line.

The third present invention provides a mask to be used for an exposure in a lithography process, the mask having inverted patterns comprising transmission regions which are positioned at a circumference of each of intended patterns of a resist film.

The fourth present invention provides a method of forming a device pattern of a semiconductor device. The method comprises the steps of: carrying out an over-exposure to a resist film with the use of a mask which has inverted patterns comprising transmission regions which are positioned about a circumference of each of intended patterns of a resist film; carrying out a development of the resist film to form a resist pattern having the intended patterns; and forming a device pattern of a semiconductor device by use of the resist pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 9 is a plan view illustrative of a photo-mask having mask-patterns to be used in an over-exposure process involved in a lithography process for forming storage electrode patterns of the memory cell array of FIG. 8.

DISCLOSURE OF THE INVENTION

Figure 1:
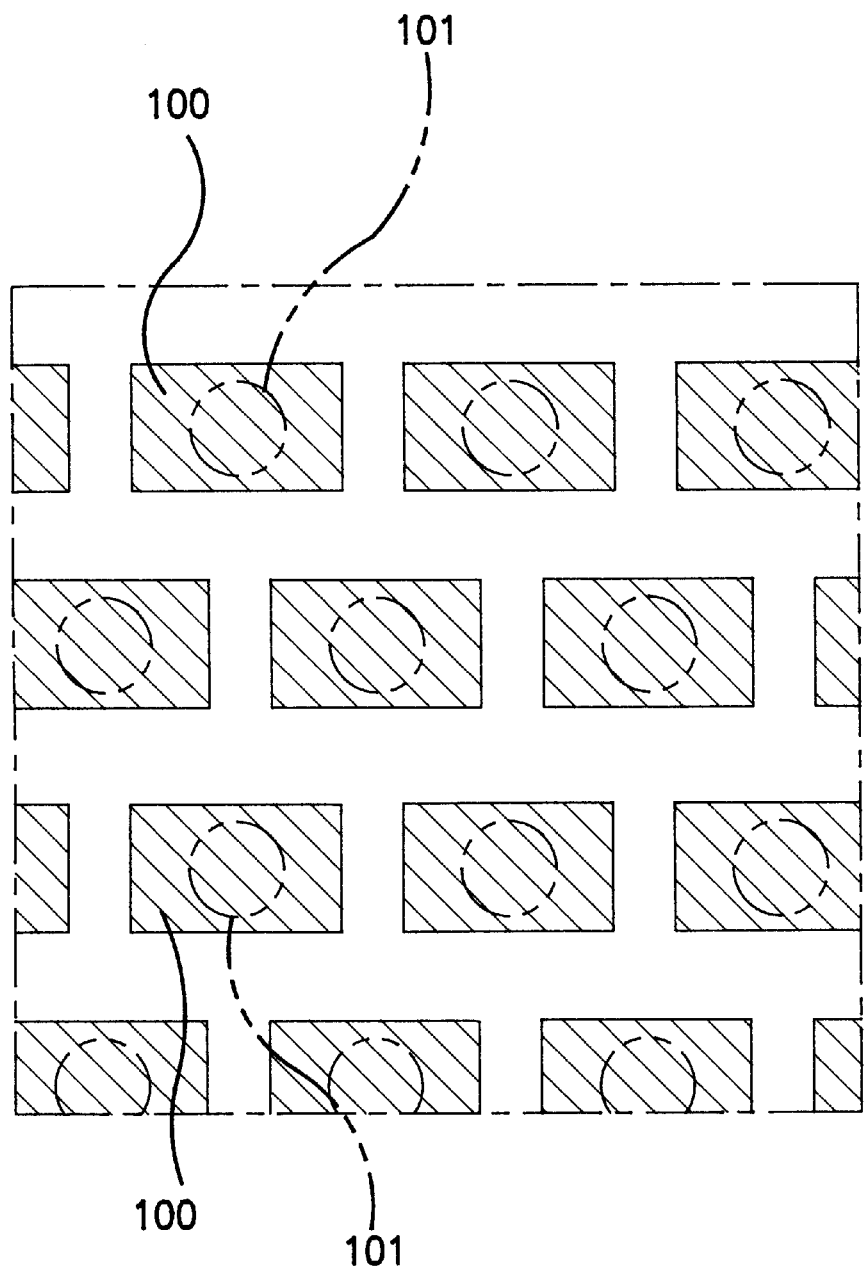
FIG. 1 is a plan view illustrative of a conventional mask pattern to be used for patterning a storage electrode or a bottom electrode of a stacked capacitor.
Figure 2:
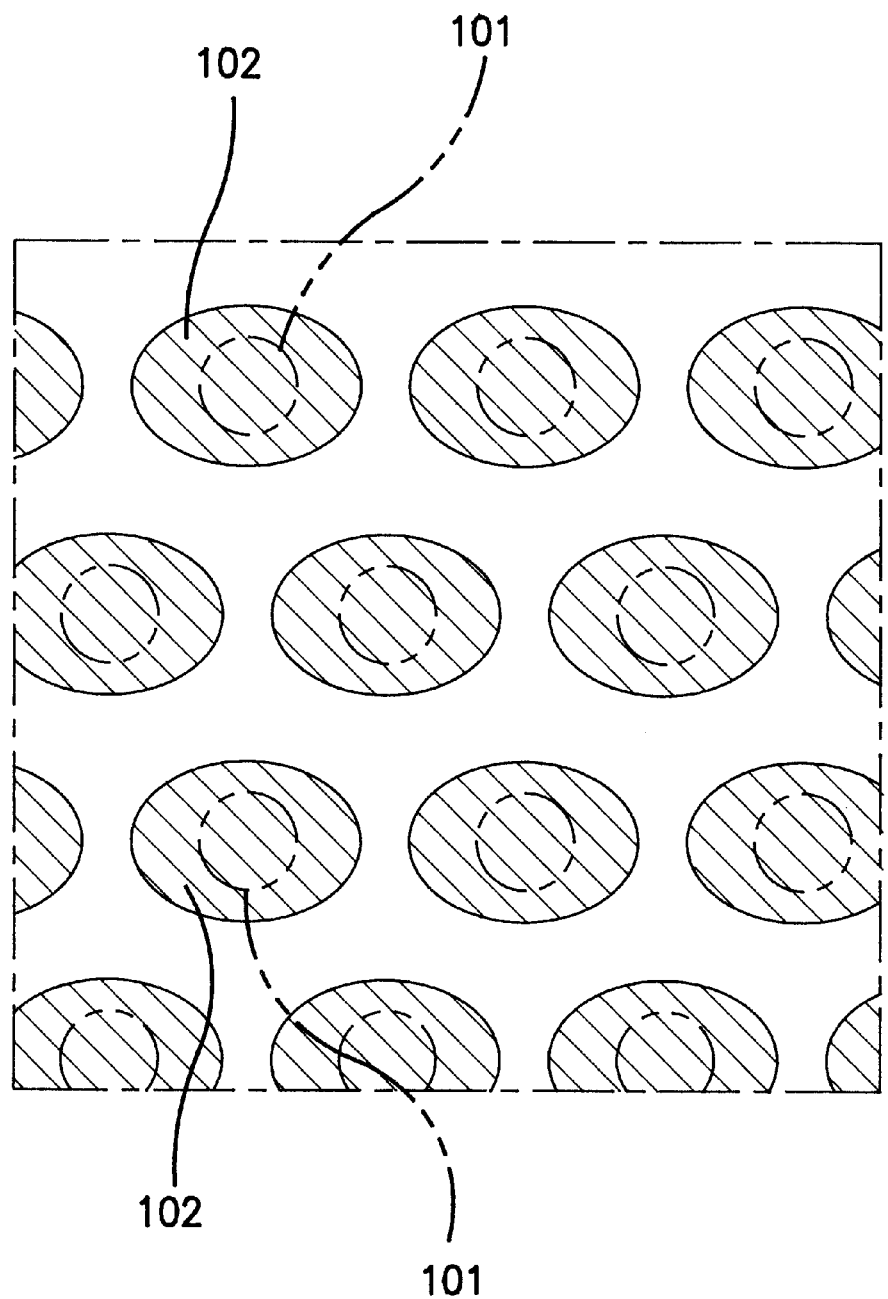
FIG. 2 is a plan view illustrative of a photo-resist pattern formed by a photo-lithography using a photo mask pattern shown in FIG. 1.
Figure 3:
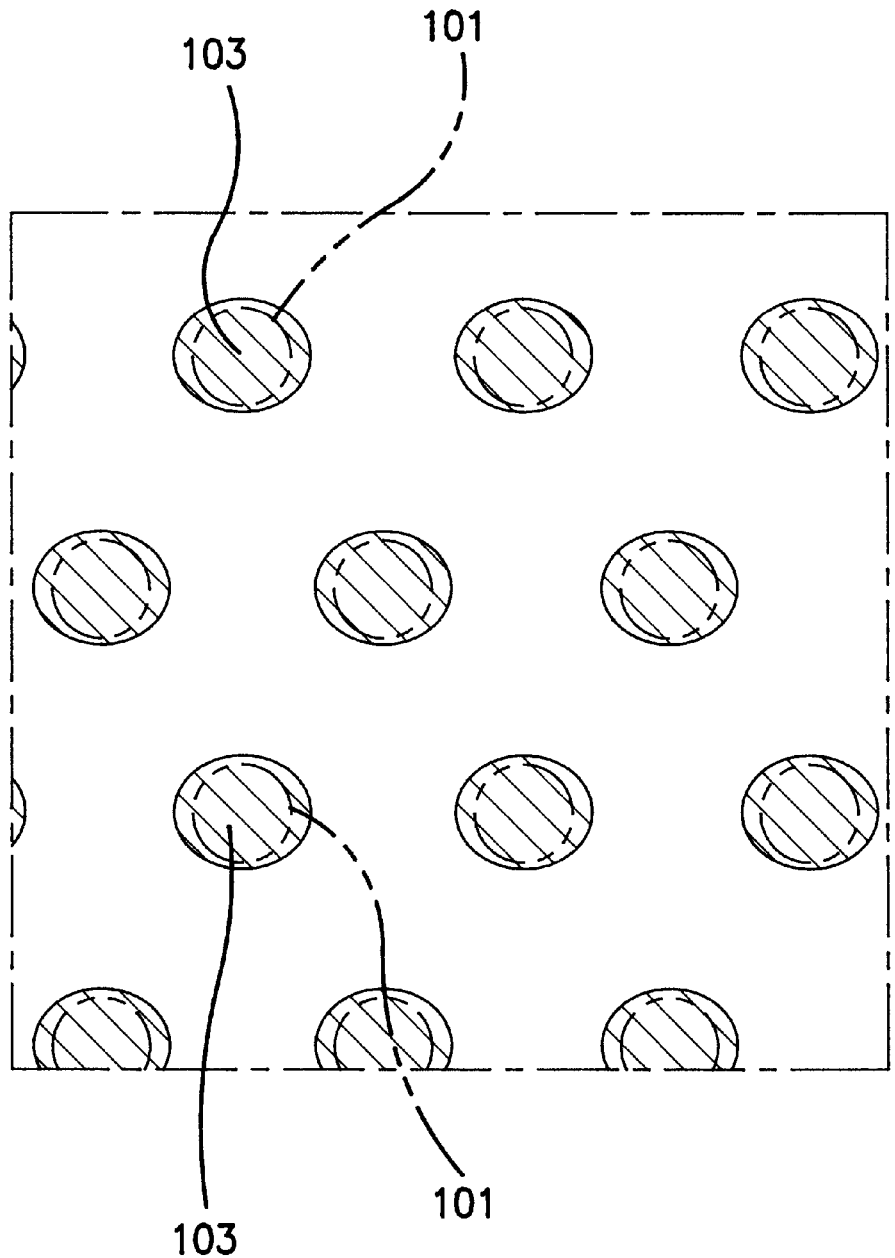
FIG. 3 is a plan view illustrative of a photo-resist pattern formed by a photo-lithography using the photo mask pattern shown in FIG. 1, wherein the size of the photo-resist pattern is close to the limitation of the resolving power of the exposure system.

The first present invention provides a semiconductor device having at least a pattern which is defined by a non-straight line.

It is preferable that the pattern is defined by inwardly arched-lines so that the pattern has a plurality of tapered corners.

It is further preferable that the inwardly arched-lines comprise six segments of six ellipses arranged to surround the pattern, where adjacent two of the six ellipses are in contact with or partially overlapped with each other.

It is further more preferable that the pattern is of a storage electrode of a capacitor of the semiconductor device.

It is moreover preferable that the capacitor is of a memory cell and the capacitor is placed under a bit-line.

It is still more preferable that a bit contact is positioned at a center of the pattern.

The second present invention also provides a resist pattern having at least a pattern which is defined by a non-straight line.

It is preferable that the pattern is defined by inwardly arched-lines so that the pattern has a plurality of tapered corners.

It is further preferable that the inwardly arched-lines comprise six segments of six ellipses arranged to surround the pattern, where adjacent two of the six ellipses are in contact with or partially overlapped with each other.

It is further more preferable that the pattern is for forming a storage electrode of a capacitor of the semiconductor device.

The third present invention provides a mask to be used for an exposure in a lithography process, the mask having inverted patterns comprising transmission regions which are positioned a circumference of each of intended patterns of a resist film.

It is preferable that the inverted patterns comprise rectangle-shaped patterns which are so arranged that six of the rectangle-shaped pattern surround an opaque area which corresponds in position to each of the intended patterns of the resist film.

It is further preferable that each of capacitive contact patterns is positioned at a center of the opaque area surrounded by six of the rectangle-shaped pattern.

The third invention provides a method of forming a resist pattern. The method comprises the steps of: carrying out an over-exposure to a resist film with the use of a mask which has inverted patterns comprising transmission regions which are positioned about a circumference of each of intended patterns of a resist film; and carrying out a development of the resist film.

It is preferable that the inverted patterns comprise rectangle-shaped patterns which are so arranged that six of the rectangle-shaped pattern surround an opaque area which corresponds in position to each of the intended patterns of the resist film.

It is further preferable that each of capacitive contact patterns is positioned at a center of the opaque area surrounded by six of the rectangle-shaped pattern.

The fourth present invention provides a method of forming a device pattern of a semiconductor device. The method comprises the steps of: carrying out an over-exposure to a resist film with the use of a mask which has inverted patterns comprising transmission regions which are positioned about a circumference of each of intended patterns of a resist film; carrying out a development of the resist film to form a resist pattern having the intended patterns; and forming a device pattern of a semiconductor device by use of the resist pattern.

It is preferable that the inverted patterns comprise rectangle-shaped patterns which are so arranged that six of the rectangle-shaped pattern surround an opaque area which corresponds in position to each of the intended patterns of the resist film, so that the inwardly arched-lines comprise six segments of six ellipses arranged to surround the pattern, where adjacent two of the six ellipses are in contact with or partially overlapped with each other.

It is further preferable that each of capacitive contact patterns is positioned at a center of the opaque area surrounded by six of the rectangle-shaped pattern.

It is further more preferable that the device pattern is of a storage electrode of a capacitor of the semiconductor device.

It is moreover preferable that the capacitor is of a memory cell and the capacitor is placed under a bit-line.

It is still more preferable that a bit contact is positioned at a center of the pattern.

Figure 4:
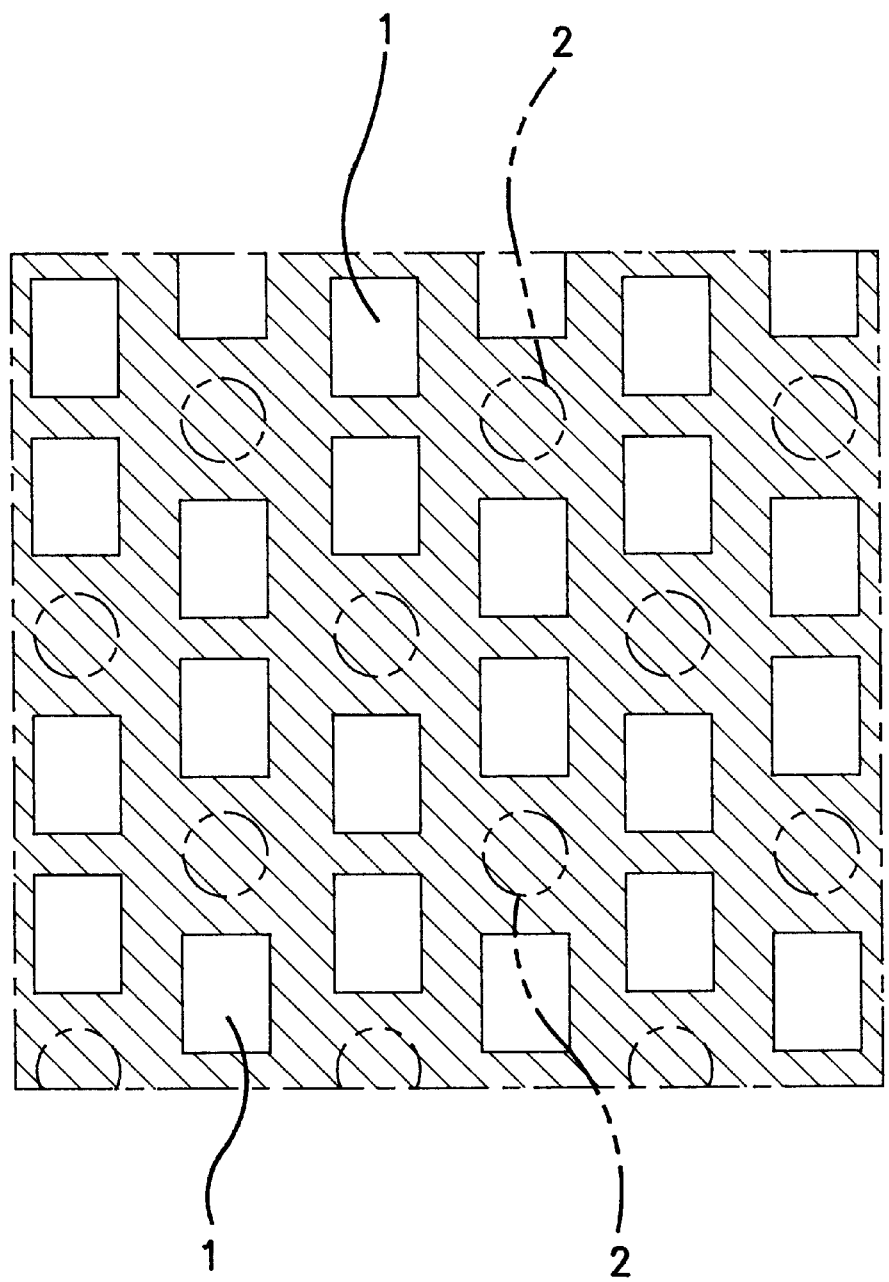
FIG. 4 is a plan view illustrative of a mask pattern to be used for an over-exposure process in accordance with the present invention.
Figure 5:
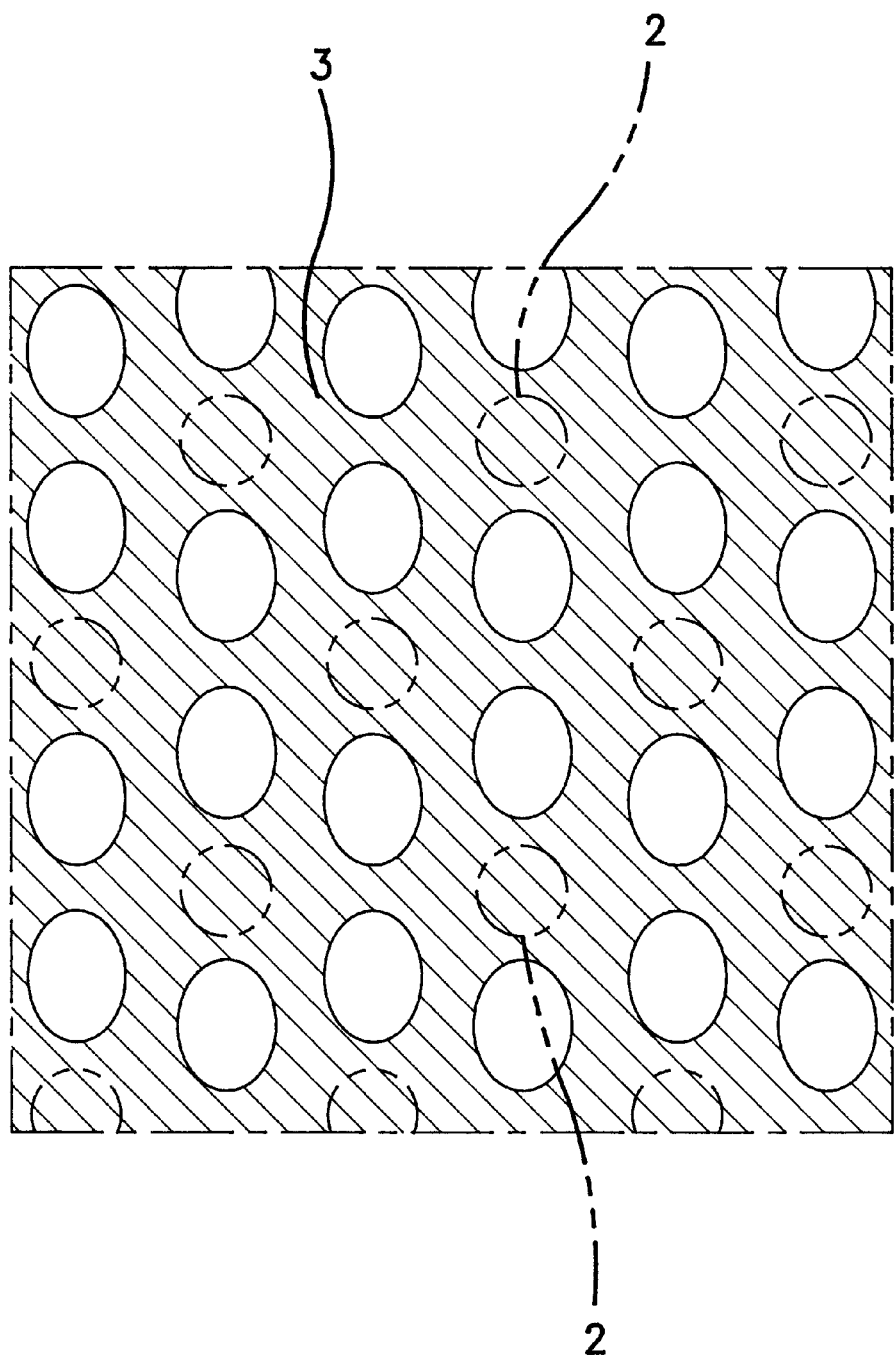
FIG. 5 is a plan view illustrative of a resist-pattern formed by a just-exposure process using a mask pattern illustrated in FIG. 4.
Figure 6:
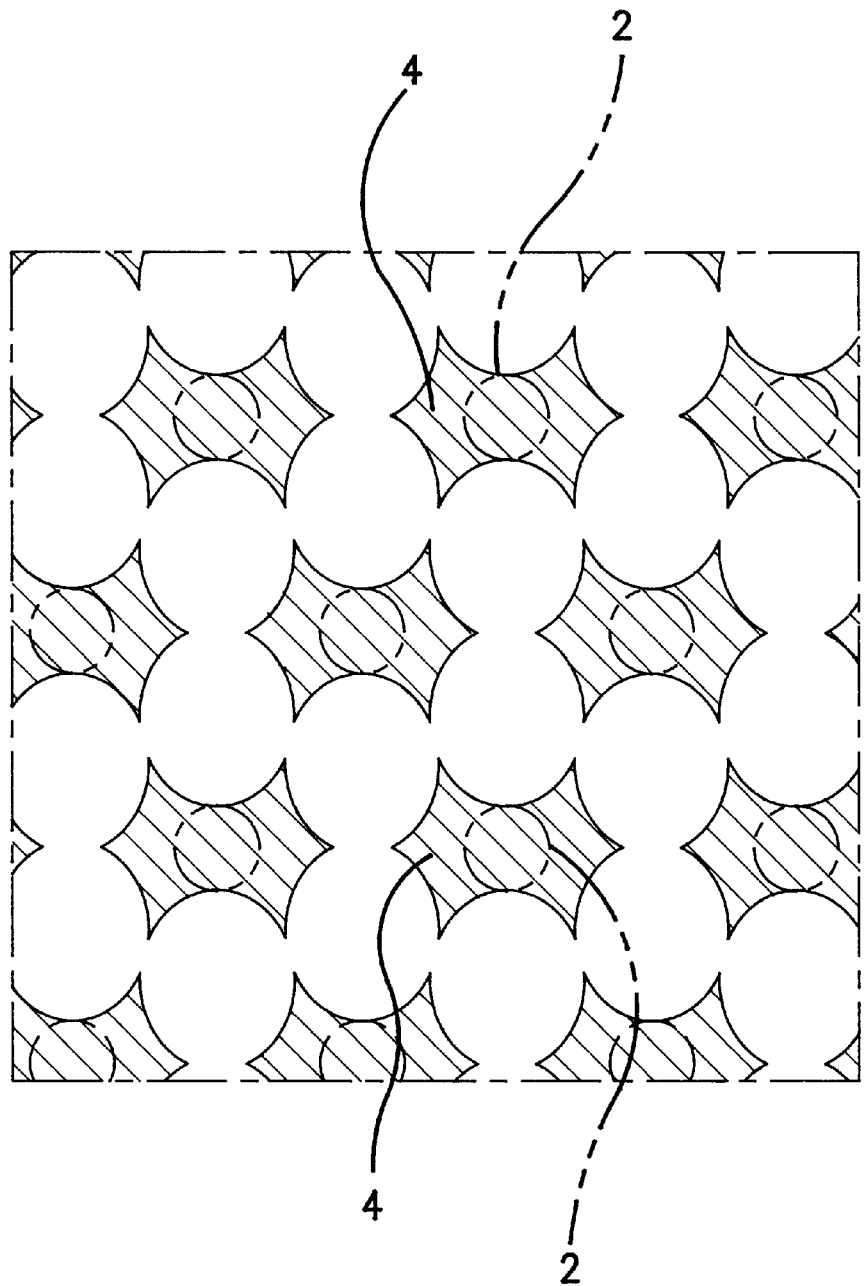
FIG. 6 is a plan view illustrative of a resist-pattern formed by an over-exposure process using a mask pattern illustrated in FIG. 4.

As described above, for the conventional method, the over-exposure causes the problem in difference in shape of the photo-resist pattern from the mask pattern. However, the present invention intentionally utilizes the over-exposure which causes large deformation of the resist-pattern from the mask pattern. FIG. 4 is a plan view illustrative of a mask pattern to be used for an over-exposure process in accordance with the present invention. FIG. 5 is a plan view illustrative of a resist-pattern formed by a just-exposure process using a mask pattern illustrated in FIG. 4. FIG. 6 is a plan view illustrative of a resist-pattern formed by an over-exposure process using a mask pattern illustrated in FIG. 4.

The photo-mask of FIG. 4 has a mask pattern which comprises an alignment of rectangle-shaped inverted patterns 1 which allow transmission of ultraviolet ray in exposure process. Cross-hatched regions are opaque regions which shield the ultraviolet ray. Rectangle-shaped inverted patterns 1 are so arranged that six of the rectangle-shaped inverted patterns 1 are positioned at six corners of a hexagon so as to surround a hexagonal opaque area which has a center at which a capacitive contact pattern 2 is positioned. The adjacent two of the six of the rectangle-shaped inverted patterns 1 are distanced from each other. A repeating pattern of the above arrangement of the rectangle-shaped inverted patterns 1 extends over an entire of the photo-mask.

The resist-pattern of FIG. 5 is obtainable by carrying out a just-exposure process with use of the photo-mask of FIG. 4. The resist-pattern comprises a positive type photo-resist. The resist-pattern of FIG. 5 has a pattern 3 which comprises an alignment of ellipse-shaped openings which have been formed by selective removal by the exposure and subsequent development. Due to the proximity effect, the exposed parts of the photo-resist have an ellipse-shape which is deformed from the rectangle-shape of the mask-pattern 1. The exposed parts in ellipse-shape of the photo-resist are removed by the subsequent development process, whereby the ellipse-shaped openings are formed in the photo-resist. The ellipse-shaped openings allow transmission of ultraviolet ray in an exposure process. Namely, the resist pattern 3 obtained by the just-exposure process has such an alignment of ellipse shaped openings that six of the ellipse-shaped openings are positioned at six corners of the hexagon so as to surround a hexagonal resist area which has a center at which a capacitive contact pattern 2 is positioned. The adjacent two of the six of the ellipse-shaped openings of the resist pattern 3 are distanced from each other. A repeating alignment of the above ellipse-shaped openings extends over an entire of the resist pattern 3.

The resist-pattern of FIG. 6 is obtainable by carrying out an over-exposure process with use of the photo-mask of FIG. 4. The resist-pattern comprises a positive type photo-resist. The resist-pattern of FIG 6 has a pattern 4 which comprises a plane which is given by six corners and six arched lines, each connecting between two of the six corners. The arched lines correspond to parts of ellipses. Namely, a circumference of the pattern 4 is defined by six ellipse-shaped openings which have centers positioned at six corners of the hexagon, where adjacent two of the six ellipse-shaped openings are in contact with each other or are partially overlapped with each other so that the six ellipse-shaped openings completely surround the pattern 4. Each of the resist patterns 4 has a capacitive contact pattern 2 at its center portion. As compared to the ellipse-shaped openings of the resist pattern 3 of FIG. 5, the ellipse-shaped openings of the resist pattern 4 are larger in size but are the same in center position thereof. Namely, the ellipse-shaped openings of the resist pattern 3 obtained by the just-exposure is further enlarged by the over-exposure whereby the larger ellipse-shaped openings are formed so that the adjacent two of the six ellipse-shaped openings are in contact with or are partially overlapped with each other. Due to the proximity effect, the exposed parts of the photo-resist have an ellipse-shape which is deformed from the rectangle-shape of the mask-pattern 1. The exposed parts in ellipse-shape of the photo-resist are removed by the subsequent development process, whereby the ellipse-shaped openings are formed in the photo-resist. Namely, the resist pattern 4 obtained by the over-exposure process has such an alignment of ellipse-shaped openings that six of the ellipse-shaped openings are positioned at six corners of the hexagon so as to surround the resist-pattern 4 which has a center at which a capacitive contact pattern 2 is positioned. The resist-pattern 4 comprises the hexagon comprising a plane which is given by six corners and six arched lines, each connecting between two of the six corners. The arched lines correspond to parts of ellipse-shaped openings. Namely, a circumference of the pattern 4 is defined by six ellipse-shaped openings which have centers positioned at six corners of the hexagon, where adjacent two of the six ellipse-shaped openings are in contact with each other or are partially overlapped with each other so that the six ellipse-shaped openings completely surround the pattern 4. As the degree of over-exposure is increased, the size of each of the ellipse-shaped openings is increased, whilst the size of the resist pattern 4 is decreased. Namely, the size of the resist pattern 4 can be controlled by controlling the degree of over-exposure.

In this example, the mask pattern 1 is rectangle-shaped and the openings of the resist patterns are ellipse-shaped. It is not necessary to limit the shape of the mask pattern into a rectangle. Circle, ellipse and any other polygons are available as: the mask pattern 1. The number and placements of the resist patterns may be optional.

The above resist patterns 4 shown in FIG. 6 are used as a mask to carrying out an anisotropic etching to a conductive film underlying the resist patterns 4, whereby storage electrode patterns are formed which correspond in shape to the above resist pattern 4. Each of the storage electrode patterns has a plane shape which comprises six tapered corners and six inwardly arched lines connecting the six corners, so that the each of the storage electrode patterns has six tapered corners. This modified shape of the storage electrode patterns results in increase in length of the circumference of each of the storage electrode patterns. This increase in length of the circumference of each of the storage electrode patterns results in increase in surface area of each of the storage electrode without substantive increase in occupied area of the storage electrode. This increase in surface area of each of the storage electrode without substantive increase in occupied area results in substantive increase in capacity of the capacitor having the storage electrode without substantive increase in occupied area. This novel method is suitable for the fabrication process for the dynamic random access memory. This novel method is suitable for the capacitor under bit-line structure, wherein the bit lines extend over the capacitor. This means that the capacitor is limited in height by the overlying bit-lines. However, the capacitor having the storage electrode having the above modified or improved pattern has a large surface area of the storage electrode and has a large capacity with the limited area. This allows that a sufficient margin between the bit-contact and the storage electrode is ensured.

PREFERRED EMBODIMENT

Figure 7A:
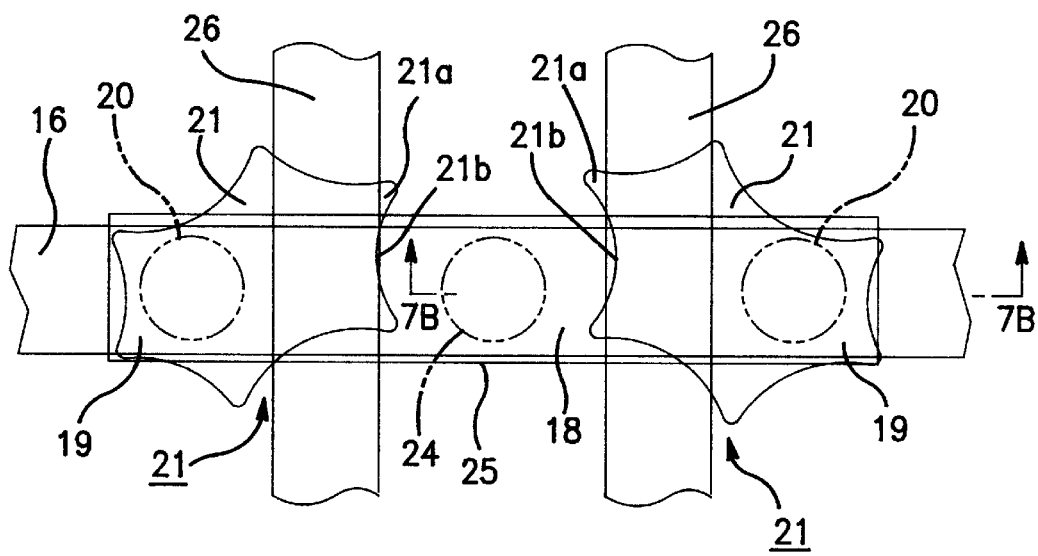
FIG. 7A is a fragmentary plan view illustrative of a memory cell of a dynamic random access memory in a preferred embodiment in accordance with the present invention.
Figure 7B:
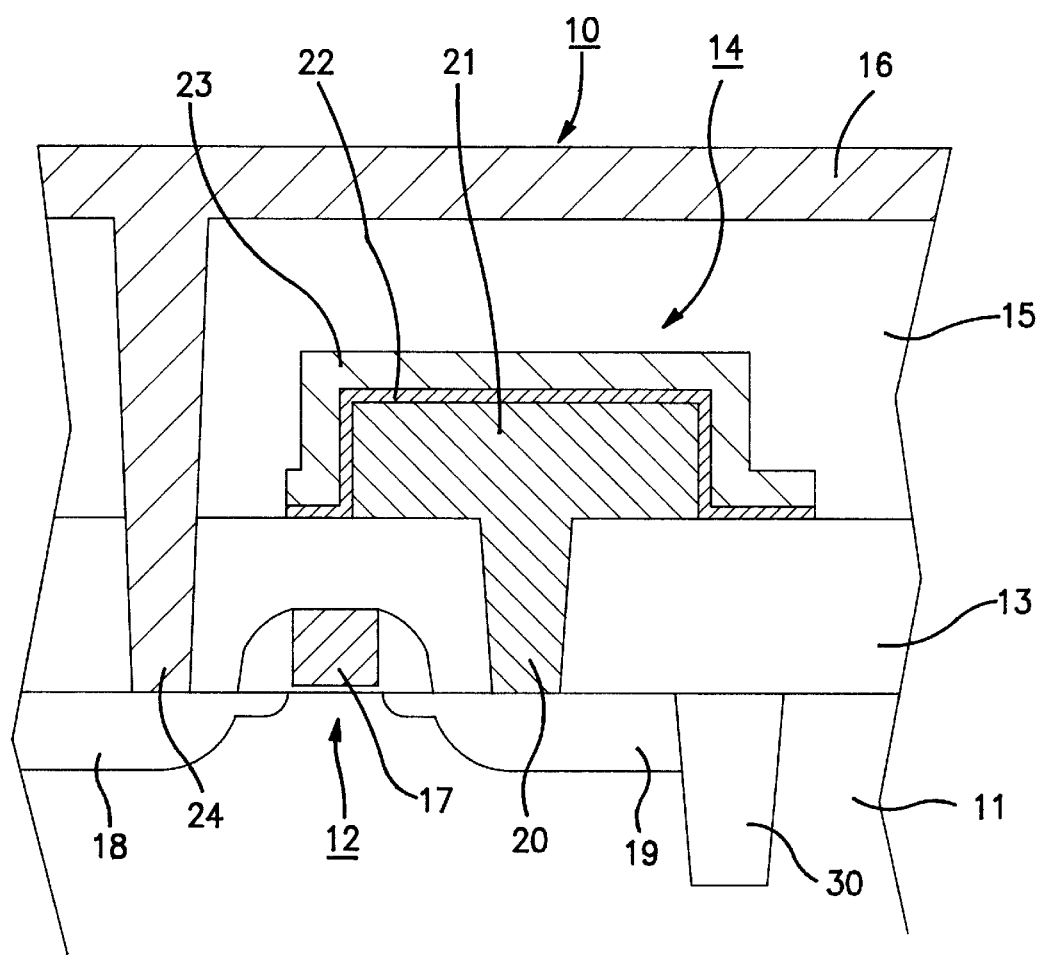
FIG. 7B is a fragmentary cross sectional elevation view illustrative of the memory cell taken along an A—A line of FIG. 7A.
Figure 8:
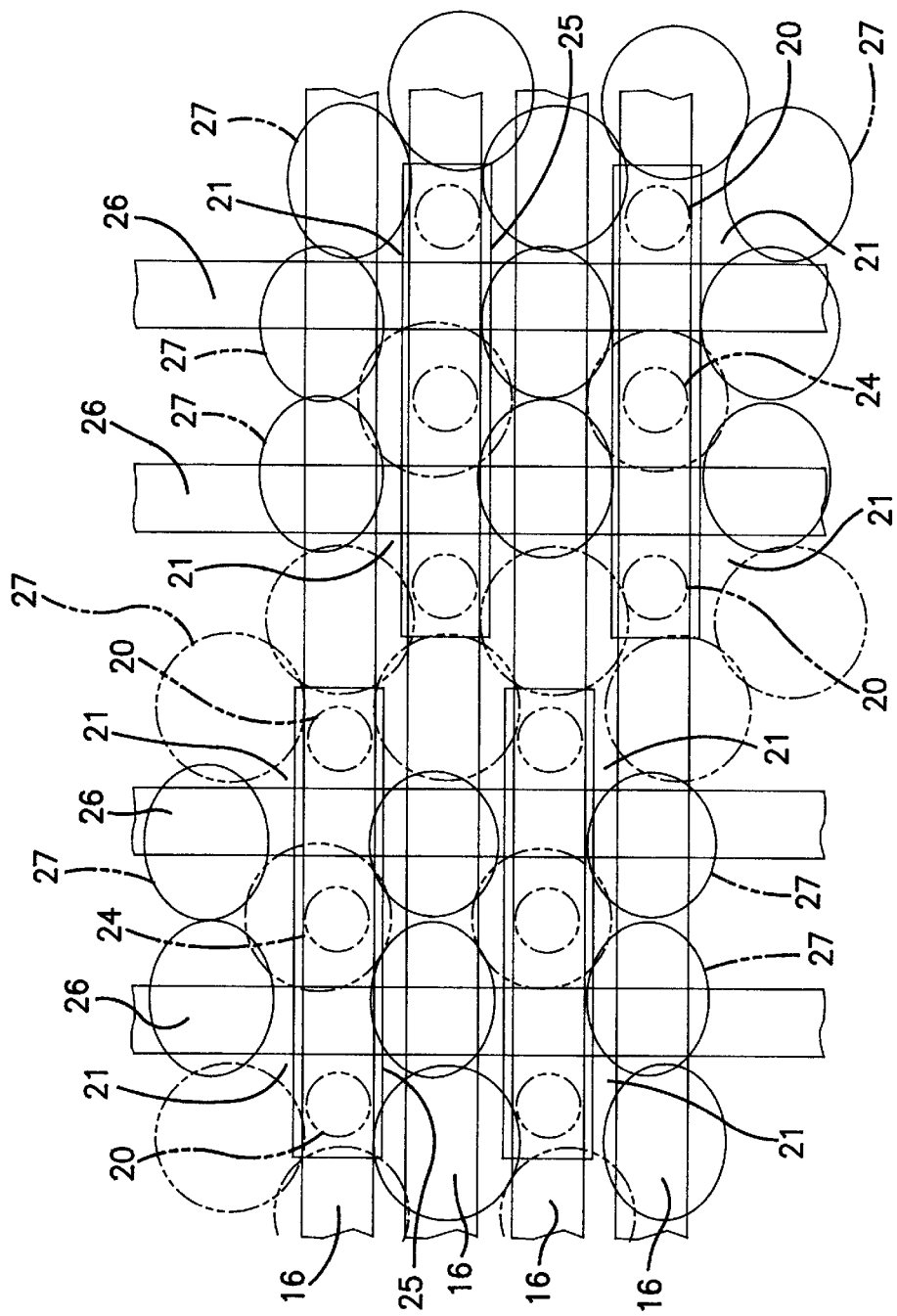
FIG. 8 is a fragmentary plan view illustrative of a memory cell array of the dynamic random access memory of FIG. 7A.

A first embodiment according to the present invention will be described in detail with reference to the drawings. FIG. 7A is a fragmentary plan view illustrative of a memory cell of a dynamic random access memory in a preferred embodiment in accordance with the present invention. FIG. 7B is a fragmentary cross sectional elevation view illustrative of the memory cell taken along an A—A line of FIG. 7A. FIG. 8 is a fragmentary plan[e] view illustrative of a memory cell array of the dynamic random access memory of FIG. 7A. FIG. 9 is a plan view illustrative of a photo-mask having mask-patterns to be used in an over-exposure process involved in a lithography process for forming storage electrode patterns of the memory cell array of FIG. 8.

With reference to FIG. 7B, a field effect transistor 12 is formed in a surface of a silicon substrate 11. A first inter-layer insulator 13 extends over the surface of the silicon substrate 11 and covers the field effect transistor 12. The field effect transistor 12 has source and drain regions 18 and 19 formed in the silicon substrate 11 by a self-alignment technique. A gate electrode 17 is formed on a gate insulator on a channel region between the source and drain regions 18 and 19. Side wall oxide films are formed on side walls of the gate electrode 17. A capacitive contact hole 20 is formed in the first inter-layer insulator 13 so that the capacitive contact hole 20 is positioned over the drain region 19. The drain region 19 is terminated by a trench isolation 30 A capacitor 14 is formed over the first inter-layer insulator 13. The capacitor 14 has a storage electrode 21, a capacitive dielectric film 22 and an opposite electrode 23. The storage electrode 21 is formed on the surface of the first inter-layer insulator 13. The storage electrode 21 is connected through a capacitive contact in the capacitive contact hole 20 to the drain region 19. The capacitive dielectric film 22 extends on a surface of the storage electrode 21. The opposite electrode 23 is formed on the capacitive dielectric film 22. A second inter-layer insulator 15 is formed over the first inter-layer insulator 13 and also covers the capacitor 14. A bit-contact hole 24 is formed which penetrates the first and second inter-layer insulators 13 and 15, so that the bit-contact hole 24 is positioned over the source region 18. A bit line 16 extends over the second inter-layer insulator 15. The bit line 16 is connected through a bit-contact in the bit-contact hole 24 to the source region 18.

With reference to FIG. 7A, a bit line 16 extends in a first direction. The rectangle-shaped diffusion pattern 25 is formed which extends in the first direction, wherein a longitudinal direction of the rectangle-shaped diffusion pattern 25 is the first direction. Two gate lines 26 extend in parallel to each other and in a second direction perpendicular to the first direction, so that the two gate lines 26 across the rectangle-shaped diffusion pattern 25. The rectangle-shaped diffusion pattern 25 is divided by the two gate lines 26 into three regions, for example, two drain regions 19 outside the two gate lines 26 and a source region 18 inside the two gate lines 26. Each of the drain regions 19 is connected with the capacitive contact to two storage electrodes 21 of the capacitors 14. The source region 18 is connected with the bit contact 24 to the bit line 16. Each of the storage electrodes 21 is defined by six tapered corners 21a and six arched lines 21b connecting the six tapered corners 21a. The storage electrode 21 has a deformed or modified hexagonal shape. Any of the six tapered corners 21a is not directed toward the bit-contact 24, and the arched line 21b is directed to an opposite direction to the bit-contact 24 so as to ensure a sufficient margin between the bit-contact 24 and the storage electrode 21.

With reference to FIG. 8, the bit lines 16 extend in parallel to each other in the first direction. The gate lines 26 extend in parallel to each other in the second direction perpendicular to the first direction. Each of the rectangle-shaped diffusion pattern 25 is formed which extends in the first direction, wherein a longitudinal direction of the rectangle-shaped diffusion pattern 25 is the first direction, so that adjacent two of the gate lines 26 across the rectangle-shaped diffusion pattern 25, whereby the rectangle-shaped diffusion pattern 25 is divided by the two gate lines 26 into three regions, for example, two drain regions 19 outside the two gate lines 26 and a source region 18 inside the two gate lines 26, Each of the drain regions 19 is connected with the capacitive contact 20 to the two storage electrodes 21 of the capacitors 14. The source region 18 is connected with the bit contact 24 to the bit line 16. Each of the storage electrodes 21 is defined by six tapered corners 21a and six arched lines 21b connecting the six tapered corners 21a, Each of the storage electrodes 21 has a pattern defined by six tapered corners and six arched lines, each connecting between two of the six tapered corners, wherein the arched lines correspond to parts of ellipses 27. Namely, a circumference of the pattern of the storage electrode 21 is defined by six ellipses 27 so arranged that individual centers of the six ellipses 27 are positioned at six corners of the hexagon. Adjacent two of the six ellipses 27 are in contact with each other or are partially overlapped with each other so that the six ellipses 27 completely surround the pattern of the storage electrode 21. The ellipses 27 correspond to over-exposed regions of the resist-film by the following over-exposure process using the mask with the mask patterns shown in FIG. 9. In FIGS. 7A and 8, illustration of patterns of the opposite electrodes is not eliminated.

With reference to FIG. 9, the photo-mask 28 has a mask pattern which comprises an alignment of rectangle-shaped inverted patterns 29a which allow transmission of ultraviolet ray in exposure process. Cross-hatched regions are opaque regions which shield the ultraviolet ray. Rectangle-shaped inverted patterns 29a are so arranged that six of the rectangle-shaped inverted patterns 29a are positioned at six corners of a hexagon so as to surround a hexagonal opaque area. The adjacent two of the six of the rectangle-shaped inverted patterns 1 are distanced from each other. A center of each of the rectangle-shaped inverted patterns 29a is positioned corresponding to the center of the ellipse 27 in FIG. 8.

FIGS. 10A through 10F are fragmentary cross sectional elevation views illustrative of memory cells in a dynamic random access memory in sequential steps involved in a novel method in a preferred embodiment in accordance with the present invention.

Figure 10A:
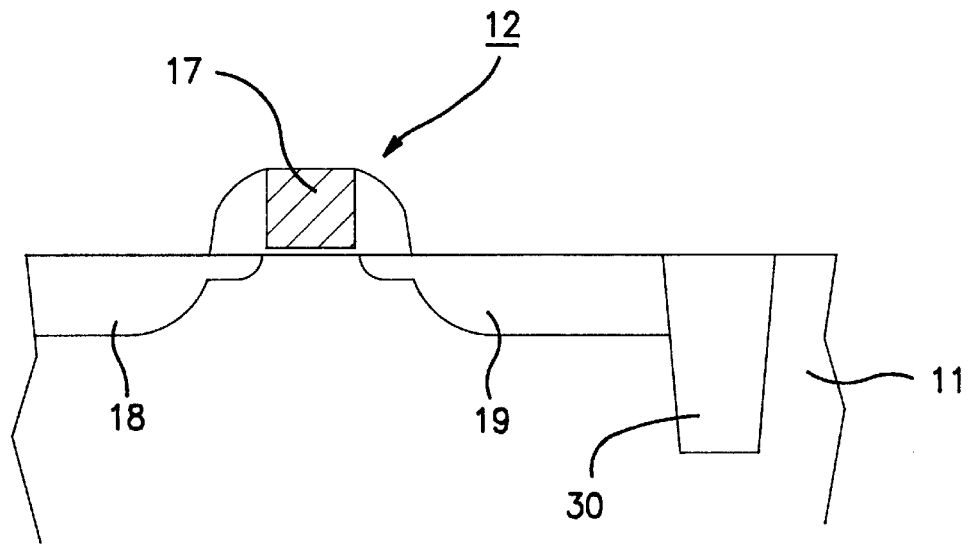
FIGS. 10A through 10F are fragmentary cross sectional elevation views illustrative of memory cells in a dynamic random access memory in sequential steps involved in a novel method in a preferred embodiment in accordance with the present invention.

With reference to FIG. 10A, a trench isolation region 30 is formed in a silicon substrate 11. A gate insulation film is formed over a surface of the silicon substrate 11. A gate electrode 17 is selectively formed on the gate insulation film. Side wall oxide films are formed on side walls of the gate electrode 17. Source and drain regions 18 and 19 are selectively formed by a self-alignment technique thereby forming a field effect transistor 12.

Figure 10B:
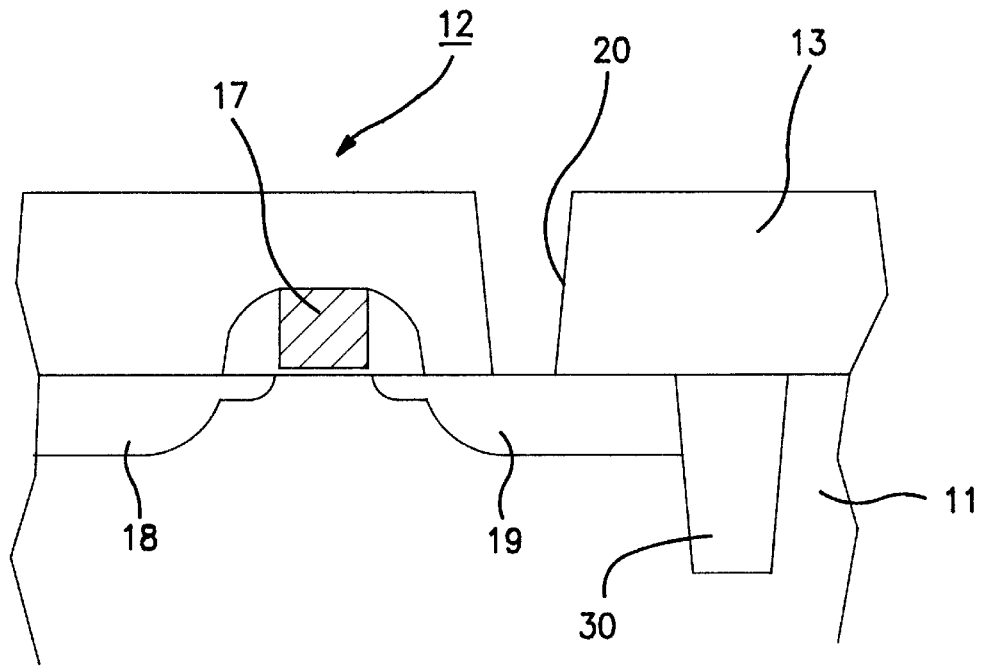

With reference to FIG. 10B, a first inter-layer insulator 13 is formed which extends over the surface of the silicon substrate 11 and covers the field effect transistor 12. A capacitive contact hole 20 is formed in the first inter-layer insulator 13 so that the capacitive contact hole 20 is positioned over the drain region 19.

Figure 10C:
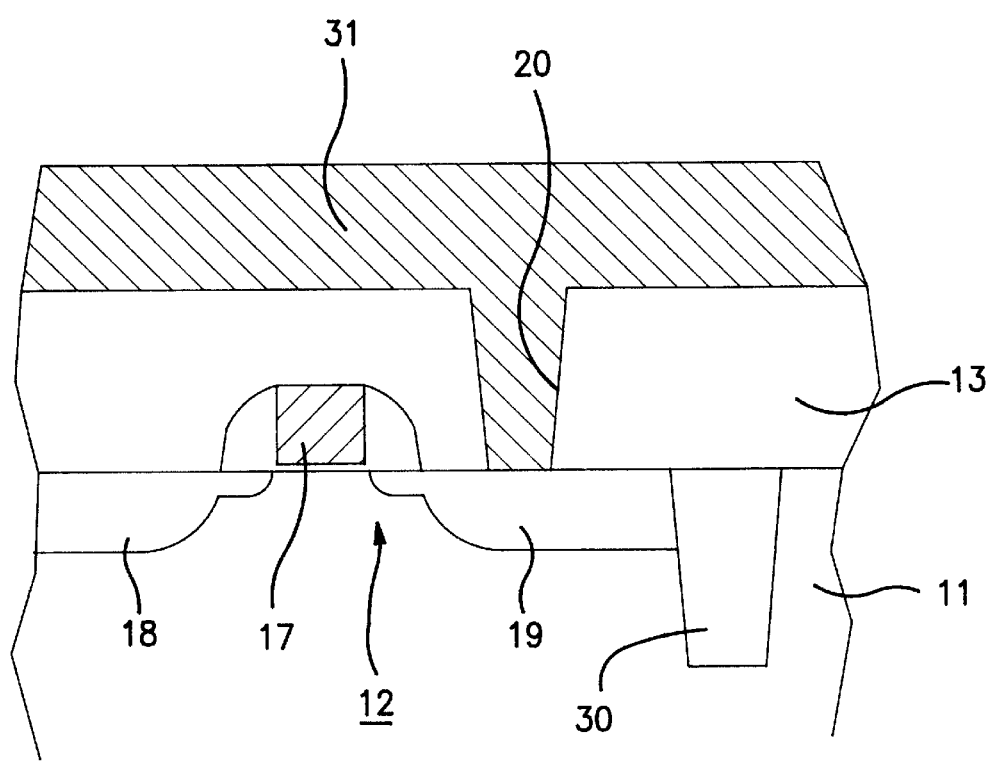

With reference to FIG. 10C, an n-doped polysilicon film 31 is entirely deposited by a chemical vapor deposition so that the n-doped polysilicon film 31 extends within the capacitive contact hole 20 and over the first inter-layer insulator 13.

Figure 10D:
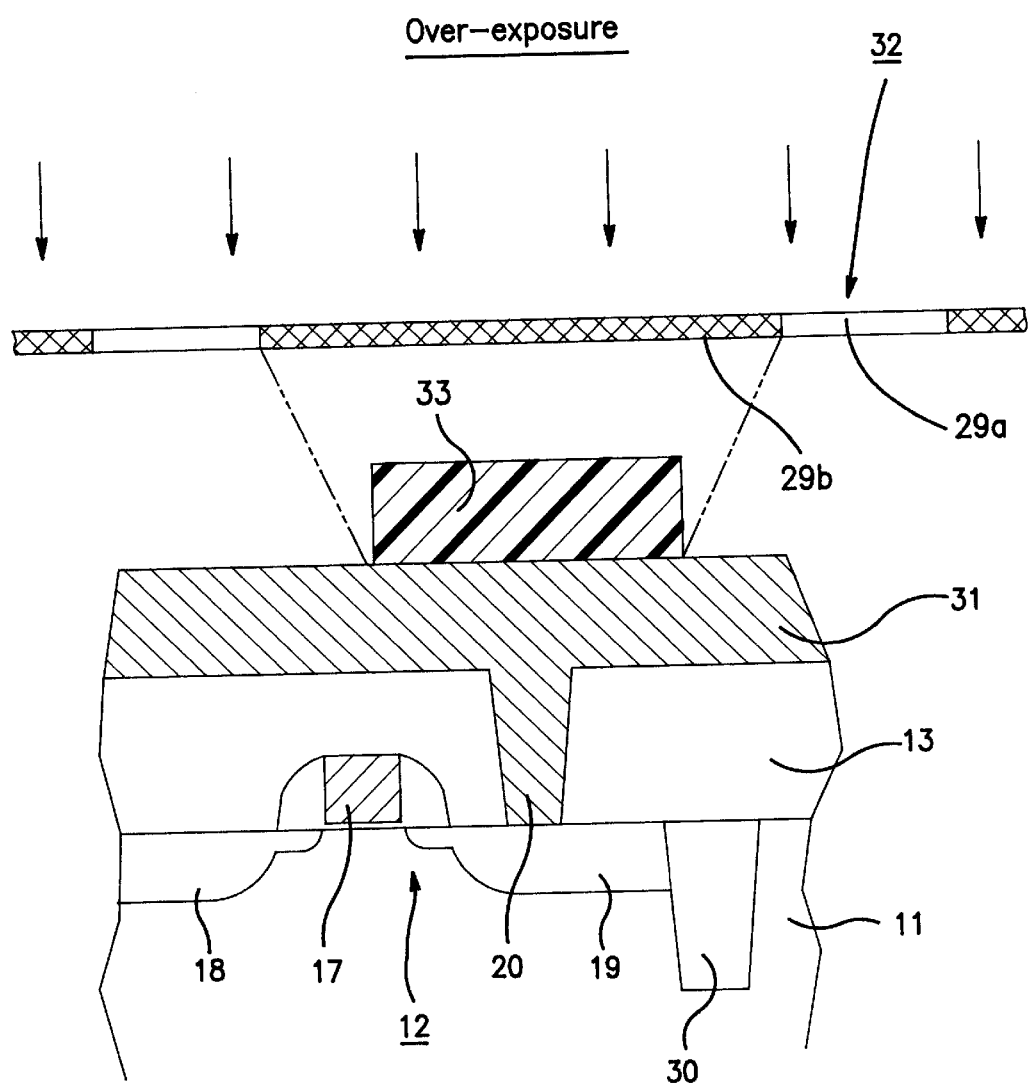

With reference to FIG. 10D, a positive type photo-resist film is entirely applied on the n-doped polysilicon film 31. A photo-mask 32 is placed over the positive type photo-resist film. The photo-mask 32 has a mask pattern 28 of FIG. 9 which comprises transmission regions 29a which allow transmission of ultraviolet ray and opaque regions 29b which shield ultraviolet ray. Each of the transmission regions 29a is rectangle-shaped. An over-exposure is carried out by use of the photo-mask 32 with the mask pattern 28. Exposed regions of the positive type photo-resist film correspond to ellipses 27 in FIG. 8. Unexposed regions of the positive type photo-resist film correspond to the pattern 21 in FIG. 8. A development is carried out to remove the exposed regions of the positive type photo-resist film, thereby forming a photo-resist pattern 33 which corresponds to the pattern 21.

Figure 10E:
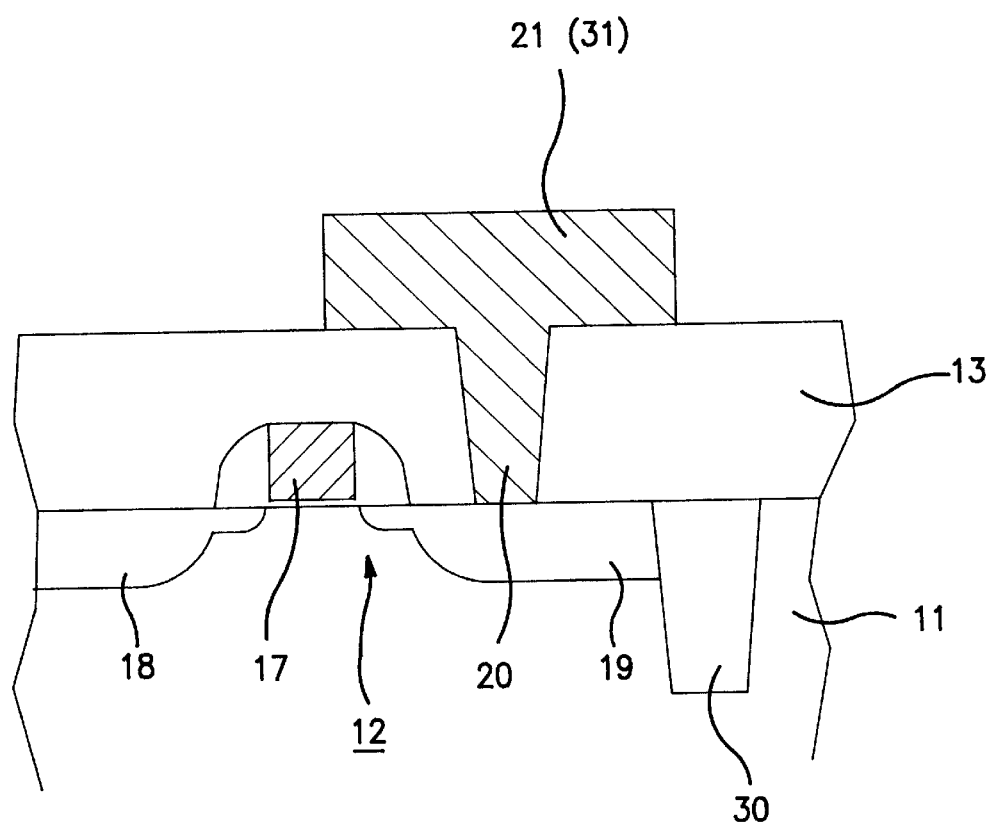

With reference to FIG. 10E, the n-doped polysilicon film 31 is subjected to an anisotropic etching by use of the photo-resist pattern 33, to selectively remove the n-doped polysilicon film 31 except under the photo-resist pattern 33, whereby a storage electrode 21 is formed which has the pattern illustrated in FIG. 8.

Figure 10F:
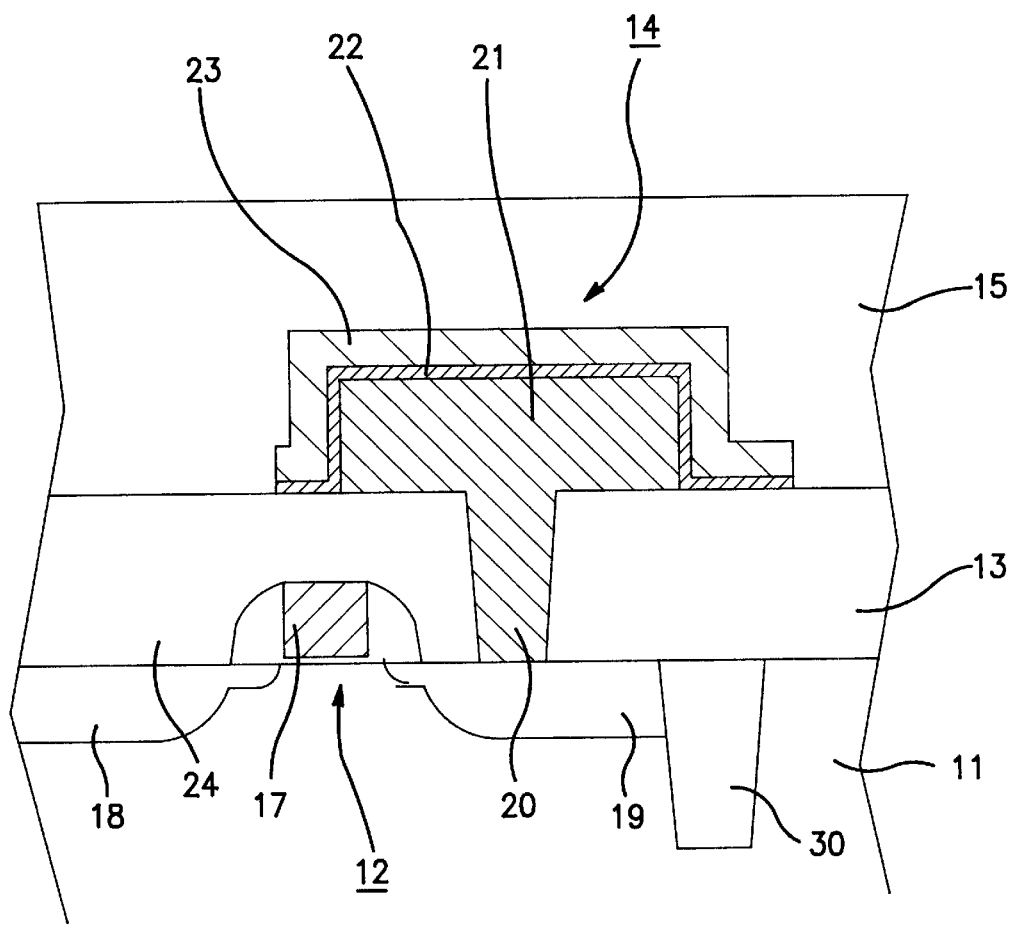

With reference to FIG. 10F, a capacitive dielectric film 22 of silicon nitride is formed which extends on a surface of the storage electrode 21 by a low pressure chemical vapor deposition method. An opposite electrode 23 of n-doped polysilicon is formed by a chemical vapor deposition method on the capacitive dielectric film 22, whereby a capacitor 14 is formed. A second inter-layer insulator 15 of silicon oxide is formed over the first inter-layer insulator 13 and also covers the capacitor 14. A bit-contact hole 24 is formed which penetrates the first and second inter-layer insulators 13 and 15, so that the bit-contact hole 24 is positioned over the source region 18. A bit line 16 is formed that extends over the second inter-layer insulator 15. The bit line 16 is connected through a bit-contact in the bit-contact hole 24 to the source region 18.

The above mask pattern has a size of 0.28 micrometers by 0.76 micrometers. A distance between adjacent two of the mask patterns is 0.24 micrometers. As an exposure system, a stepper is used which has a light source of KrF with a wavelength of 0.248 micrometers. Even a just-exposure obtaining the same distance between the resist patterns as between the mask patterns would set an exposure amount of 24 mJ, then in accordance with this embodiment, the exposure amount is set at 50 mJ to carry out the over-exposure. After the over-exposure and subsequent development, a resist pattern obtained is observed by a scanning electron microscope.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a resist pattern, said method comprising the steps of:

providing a mask having a plurality of transmission regions that are positioned around an intended pattern of a resist film;

carrying out an over-exposure to said resist film, using the mask to form an over-exposed region, said over-exposed region surrounding said intended pattern; and carrying out a development of said resist film.

2. The method as claimed in claim 1, wherein said plural transmission regions comprise rectangle-shaped patterns which are so arranged that six of said rectangle-shaped patterns surround an opaque area which corresponds in position to each of said intended patterns of said resist film.

3. The method as claimed in claim 2, further comprising a capacitive contact pattern positioned at a center of each said opaque area surrounded by six of said rectangle-shaped patterns.

4. A method of forming a device pattern of a semiconductor device, said method comprising the steps of:

providing a mask having a plurality of transmission regions that are positioned around an intended pattern of a resist film;

carrying out an over-exposure to said resist film, using the mask, to form an over-exposed region, said over-exposure region surrounding said intended pattern;

carrying out a development of said resist film to form a resist pattern having said intended pattern; and forming a device pattern of a semiconductor device by use of said resist pattern.

5. The method as claimed in claim 4, wherein said plural transmission regions comprise rectangle-shaped patterns which are so arranged that six of said rectangle-shaped patterns surround an opaque area which corresponds in position to said intended pattern of said resist film, when said resist film is developed, inwardly arched-lines are formed that comprise six segments of six ellipses arranged to surround said intended pattern of said resist film, adjacent two of said six ellipses are in contact with or partially overlap with each other.

6. The method as claimed in claim 5, further comprising a capacitive contact pattern positioned at a center of each said opaque area surrounded by six of said rectangle-shaped patterns.

7. The method as claimed in claim 6, wherein said device pattern is of a storage electrode of a capacitor of said semiconductor device.

8. The method as claimed in claim 7, wherein said capacitor is of a memory call and said capacitor is placed under a bit-line.

9. The method as claimed in claim 8, wherein a bit contact is positioned at a center of said intended pattern of said resist film.

* * * * *